US006642661B2

(12) United States Patent
Strang

(10) Patent No.: US 6,642,661 B2
(45) Date of Patent: Nov. 4, 2003

(54) METHOD TO AFFECT SPATIAL DISTRIBUTION OF HARMONIC GENERATION IN A CAPACITIVE DISCHARGE REACTOR

(75) Inventor: Eric J. Strang, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/228,184

(22) Filed: Aug. 27, 2002

(65) Prior Publication Data
US 2003/0057847 A1 Mar. 27, 2003

Related U.S. Application Data
(60) Provisional application No. 60/316,021, filed on Aug. 31, 2001, and provisional application No. 60/315,049, filed on Aug. 28, 2001.

(51) Int. Cl.[7] .................................................. H01J 7/24
(52) U.S. Cl. ........................ 315/111.21; 204/298.08; 118/723 R; 156/345.44; 156/345.47; 156/345.48
(58) Field of Search ..................... 315/111.21, 111.81, 315/160; 204/298.08; 118/723 R, 723 E; 156/345.44, 345.47, 345.48; 216/71

(56) References Cited

U.S. PATENT DOCUMENTS

| 5,166,482 | A | * | 11/1992 | Li .............................. 200/52 R |
|---|---|---|---|---|
| 5,981,899 | A | * | 11/1999 | Perrin et al. ............ 219/121.52 |
| 6,042,686 | A | * | 3/2000 | Dible et al. ............. 156/345.44 |
| 6,281,469 | B1 | * | 8/2001 | Perrin et al. ............ 219/121.43 |
| 6,534,133 | B1 | * | 3/2003 | Kaloyeros et al. ........... 427/576 |
| 2003/0079983 | A1 | * | 5/2003 | Long et al. .................. 204/164 |

FOREIGN PATENT DOCUMENTS

| JP | 04048727 | 2/1992 |
|---|---|---|
| JP | 03016821 | 3/2000 |
| WO | WO 01/63642 | 8/2001 |
| WO | WO 01/73814 | 10/2001 |
| WO | WO 01/76326 | 10/2001 |

* cited by examiner

Primary Examiner—Don Wong
Assistant Examiner—Thuy Vinh Tran
(74) Attorney, Agent, or Firm—Pillsbury Winthrop LLP

(57) ABSTRACT

The present invention provides an apparatus and a method of generating and controlling plasma formed in a capacitively coupled plasma region between a plasma electrode and a bias electrode. The plasma electrode includes a plurality of sub-electrodes that are electrically insulated from one another. Radio frequency plasma generating electric power is provided to the plasma electrode. Radio frequency bias electric power, at a lower frequency than the plasma generating radio frequency electric power, is also provided. A first portion of the bias electric power is provided to the bias electrode, and a second portion of the bias electric power is provided to the plasma electrode. At least one filter, impedance matching network, phase shifter, and power splitter are used to affect the electric power provided to the electrodes.

24 Claims, 1 Drawing Sheet

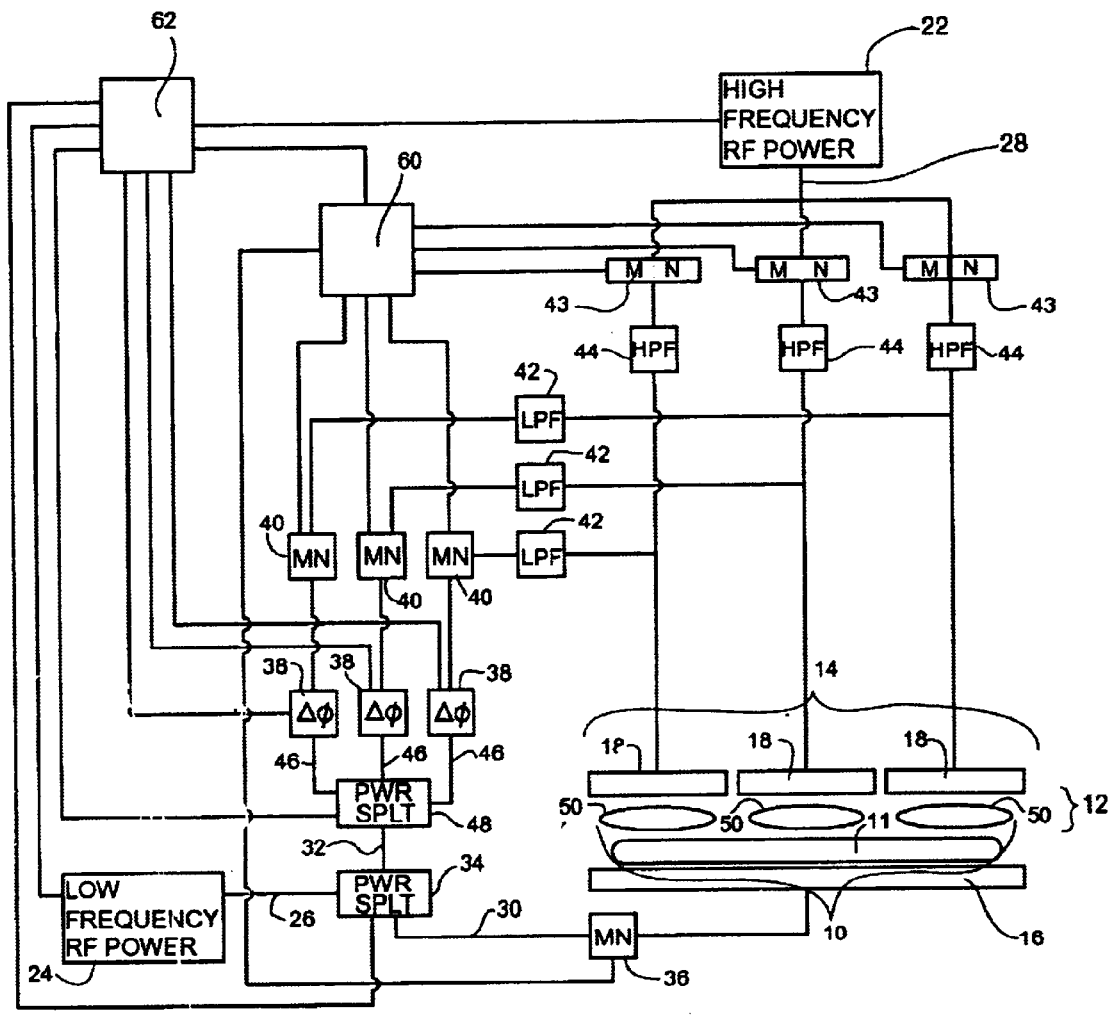

METHOD TO AFFECT SPATIAL DISTRIBUTION OF HARMONIC GENERATION IN A CAPACITIVE DISCHARGE REACTOR

CROSS-REFERENCE TO RELATED APPLICATIONS

This application derives the benefit of U.S. Provisional applications 60/315,049, filed Aug. 28, 2001, and 60/316,021, filed Aug. 31, 2001.

BACKGROUND OF THE INVENTION

1. Field of the Invention

This invention relates generally to the field of plasma processing, and more particularly to capacitively coupled discharge plasma reactors.

2. Description of Related Art

Capacitive discharge plasma reactors are widely used to process semiconductor substrates, display substrates or the like. In these reactors, a plasma is formed when a gas (or gas mixture) is energized, leaving a mixture of charged and uncharged particles. The plasma can then be used to etch or form a deposit on a substrate.

A typical capacitive discharge plasma reactor uses a high-frequency electrode and a low-frequency electrode to generate plasma. These two electrodes are placed opposed to one another, spaced a short distance apart within a sealable chamber. This placement of the two electrodes forms a classic parallel plate capacitor, in which the low-power electrode acts as a holder (i.e., a chuck) for the workpiece to be processed.

During the operation of the plasma reactor, a gas or mixture of gases is introduced into the sealable chamber, and alternating current (AC) power is applied to the high-frequency electrode to generate the plasma. The power applied to the high-frequency electrode is typically in the radio frequency (RF) range, for example, 60 MHz. Typically, lower frequency AC power, 2 MHz for example, is applied to the low-frequency electrode in order to provide the workpiece with some bias, which modulates the effect of the plasma on the workpiece. This modulation occurs because the application of power to both the electrodes generates an electric field between them, thus influencing the characteristics of the charged particles of the plasma that strike the workpiece.

The plasmas generated by such plasma reactors are nonlinear; that is, at typically applied power levels, the impedance (resistance to electrical current flow) of the plasma is not directly proportional to the applied voltage. This nonlinearity causes the electrical properties of the plasma to be nonuniform. For example, several power frequencies (i.e. harmonics of the drive frequencies) can be present in different portions of the same plasma due to the nonlinear behavior of the plasma sheaths, even if only a single power frequency was used to generate the plasma. The use of such a nonuniform plasma can result in a workpiece that is not uniformly processed. A nonuniformly etched workpiece is undesirable in most plasma processing, and in many cases can have poor yield, or must be discarded.

SUMMARY OF THE INVENTION

The present invention provides an apparatus and a method of generating and controlling a plasma formed in a capacitively coupled plasma source having a plasma electrode and a bias electrode. The plasma electrode includes a plurality of sub-electrodes that are electrically insulated from one another. The plasma is formed in a plasma region between the plasma electrode and the bias electrode.

The method includes providing a radio frequency plasma generating electric power to the plasma electrode. The method also includes providing a radio frequency bias electric power at a lower frequency than the plasma generating radio frequency electric power. A first portion of the bias electric power is provided to the bias electrode, and a second portion of the bias electric power is provided to the plasma electrode.

The apparatus includes a capacitively coupled plasma source having a plasma electrode and a bias electrode. The plasma electrode includes a plurality of sub-electrodes that are electrically insulated from one another. The plasma electrode is spaced from the bias electrode by a plasma region in which the plasma is formed. The apparatus also includes a radio frequency plasma generating electric power supply in electrical communication with the plasma electrode, and a radio frequency bias generating electric power supply in electrical communication with the bias electrode and the plasma electrode.

BRIEF DESCRIPTION OF THE DRAWINGS

The figure is a schematic view of the capacitive discharge plasma reactor.

DETAILED DESCRIPTION OF THE EMBODIMENTS

The figure shows the structure of a capacitively coupled plasma reactor according to the present invention. Two parallel electrodes 14, 16 forming capacitor plates are arranged opposed to one another. The electrode 14 is segmented and is supplied with a high-frequency signal. Electrode 16 is supplied with a low-frequency signal. The bias electrode 16 can act as a holder (i.e., a chuck) for the workpiece 11 that is to be etched. A gas source and exhaust, not shown, allow gas to enter the plasma generation region 12 between the plasma electrode 14 and the bias electrode 16. The plasma electrode 14 and the bias electrode 16 are excited by one or more radio frequency power supplies 22, 24 to generate plasma 10 in the plasma region 12 of the plasma reactor. Typically, the plasma electrode 14 can be excited at a primary frequency of 60 MHz, and the bias electrode 16 can be excited at a frequency of 2 MHz. One aspect of the present invention involves applying a portion of the lower frequency power to the upper electrode.

The figure shows the interconnections between the radio frequency power sources 22, 24 and the plasma electrode 14 and bias electrode 16 in greater detail. Radio frequency bias generating electric power 26 can be applied to the bias electrode 16 in order to provide a workpiece 11 with bias. The bias electric power 26 can originate from a low-frequency radio frequency power source 24, and subsequently can be split into a first portion 30 and a second portion 32 by at least one power splitter 34. The first portion 30 of the bias electric power 26 can be applied to the bias electrode 16 through at least one impedance matching network 36 prior to being applied to the bias electrode 16.

The second portion 32 of bias electric power 26 can be split by at least one power splitter 48, and portions 46 can be processed by one or more phase shifters 38, impedance matching networks 40, and/or low pass filters 42 before being applied to the plasma electrode 14. The second portion 32 of the bias electric power 26 can be superposed upon high-frequency plasma generating electric power 28 applied to the plasma electrode 14.

Plasma generating electric power 28 can be applied to the plasma electrode 14 through impedance match networks 43 in order to generate plasma 10 in the plasma region 12 of the plasma reactor. For additional details, the application of RF power to a multi-segment electrode 14 is described in pending PCT applications U.S. Ser. No. 01/04562 and U.S. Ser. No. 01/09199, and are, therefore, incorporated herein by reference in their entirety. The plasma generating electric power 28 can be filtered by at least one high pass filter 44 to electrically isolate the high frequency RF power generator 22 and its impedance match network (not shown) from the low frequency RF power present at plasma electrode 14 associated with low frequency RF power generator 24 prior to being applied to the plasma electrode 14.

As mentioned above, the plasma electrode 14 can include a plurality of sub-electrodes 18. The plasma sub-electrodes 18 are electrically insulated from one another, and can be in communication with both the plasma generating electric power 28 and the bias electric power 26 by an electrical connection which may include at least one filter 42, 44, impedance matching network 40, 43, phase shifter 38, and/or power splitter 34, 48.

To achieve spatial adjustment of the redistribution of power to harmonic frequencies locally within the plasma 10, the bias electric power 32 sent to each plasma sub-electrode 18 can be individually adjusted. In a preferred embodiment, the adjustment of power and phase to each sub-electrode 18 is achieved via empirically determined relations described below. A single power splitter (not illustrated) may be used to replace power splitter 34 and power splitter 48, depending upon the particular embodiment of the present invention.

Impedance match networks 36, 40 and 43 can be operated by commands from a match network controller 60. Match networks 36, 40 and 43, having a conventional topology (i.e. L-type, T-type, P-type, etc.), are designed to minimize reflected power and, hence, maximize the RF power transferred to the load. Utilizing measurements of the forward and reflected power from a 4-port directional coupler (not shown) and power meters (not shown), controller 60 can send electrical signals to match networks 36, 40 and 43 to adjust variable capacitors (not shown) in order to form a reactive impedance sufficient to "balance" the reactive load impedance seen by the match network. The above description is well known to those skilled in the art of RF systems.

Furthermore, computer 62 is utilized to control match network controller 60; RF generators 22, 24; power splitters 34, 48; and phase shifters 38 according to a stored process recipe. The process recipe for adjusting the respective high frequency and low frequency powers delivered to sub-electrodes 18 and bias electrode 16 as well as the relative phases between low frequency power applied to sub-electrodes 18 can be determined empirically as described below.

The respective portion 46 of the bias electric power 32 provided to each of the plasma sub-electrodes 18 is modified to spatially adjust the redistribution of power to harmonic frequencies locally within the plasma 10. At least one phase shifter 38, impedance matching network 40, and/or filter 42 can modify each respective portion 46 of the bias electric power 32 before it is applied to each plasma sub-electrode 18.

The phase shifter 38 can adjust the phase difference between each respective portion 46 of low-frequency bias electric power 32 applied to each sub-electrode 18, relative to the voltage applied to the lower bias electrode 16. The fraction of each respective portion 46 of low-frequency bias electric power 32 applied to each plasma sub-electrode 18, versus the total amount of bias electric power 32 applied to the plurality of plasma sub-electrodes 18, can be adjusted by the power splitter 48 and/or the fraction can be used as a variable when adjusting the phase of each respective portion 46 of the bias electric power 32 applied to each plasma sub-electrode 18.

The RF power distribution recipe (including any one of the settings for low frequency power output from RF generator 24, high frequency power output from RF generator 22, power splitting ratio at power splitter 34, power splitting ratio(s) at power splitter 48 and phase shift at phase shifter(s) 38) can be correlated to the plasma uniformity and/or substrate properties (etch rate uniformity, film deposition uniformity, etc.), via a design-of-experiments (DOE) approach, in which a large number of tests is made, so a meaningful correlation is obtained. This correlation can be programmed in the form of a look-up table database in the tool controller. Then, during process, when a power distribution recipe is known from measurements either of plasma uniformity or etch/deposition performance, an estimate of the achievable uniformity can be obtained from the look-up table database, via interpolation in it. If this uniformity is not satisfactory, then a control signal is sent to all segments to adjust their power distribution settings to a setpoint where the desired uniformity is obtained, in combination, of course, with other operating parameters of the current process in the tool and according to the trends observed in the DOE look-up table database.

It may be possible to tune each region 50 of the plasma 10. This is due in part to the high aspect ratio of the plasma region, i.e. the diameter of the plasma region can be much greater than the height of the plasma region. Varying the phase and/or relative fraction of bias electric power 46 applied to each sub-electrode 18 can affect the tuning of each region 50 of the plasma 10. The plasma 10 can be tuned to achieve a condition in which there is lower harmonic content, which can improve the plasma uniformity within the plasma region 12, and can correspondingly improve the etch uniformity of the wafers 11 within the plasma region 12.

In an alternate embodiment, the RF power distribution recipe is adjusted according to feedback provided from a multi-site optical emission recorder monitoring regions of the plasma 50 as shown in the figure to first order, the intensity of light of emitted from each plasma region 50 can be correlated with the local plasma density by calibration of the optical system. On the other hand, a correlation between the RF power distribution recipe settings, optical emission data and etch/deposition performance can be predetermined via a DOE approach described above. The implementation of a multi-site optical emission monitoring system within a plasma electrode 14 is described in greater detail in pending PCT application U.S. Ser. No. 01/10556.

It will thus be seen that the objects of this invention have been fully and effectively accomplished. It will be realized, however, that the foregoing preferred specific embodiments have been shown and described for the purpose of illustrating the functional and structural principles of this invention and are subject to change without departure from such principles. Therefore, this invention includes all modifications encompassed within the spirit and scope of the following claims.

What is claimed is:

1. A method of generating and controlling a plasma formed in a capacitively coupled plasma source having a plasma electrode and a bias electrode, the plasma electrode comprising a plurality of sub-electrodes that are electrically insulated from one another and the plasma being formed in a plasma region between the plasma electrode and the bias electrode, said method comprising:

provided a radio frequency plasma generating electric power to the plasma electrode;

operating a radio frequency bias electric power at a lower frequency than the plasma generating radio frequency electric power; and providing a first portion of the bias electric power to the bias electrode and a second portion of the bias electric power to the plasma electrode.

2. A method as in claim 1 further comprising filtering the plasma generating electric power applied to the plasma electrode.

3. A method as in claim 1 wherein the second portion of the bias electric power is substantially evenly split between each of the plurality of sub-electrodes.

4. A method as in claim 1 wherein the second portion of the bias electric power is unevenly split between each of the plurality of sub-electrodes.

5. A method as in claim 4 further comprising controlling a phase component of the second portion of the bias electric power applied to each sub-electrode.

6. A method as in claim 4 further comprising filtering the second portion of the bias electric power applied to each sub-electrode.

7. A method as in claim 1 further comprising controlling a phase component of the second portion of the bias electric power applied to each sub-electrode.

8. A method as in claim 1 further comprising filtering the second portion of the bias electric power applied to each sub-electrode.

9. An apparatus for generating and controlling a plasma comprising:

a capacitively coupled plasma source having a plasma electrode and a bias electrode, the plasma electrode comprising a plurality of sub-electrodes that are electrically insulated from one another and said plasma electrode being spaced from said bias electrode by a plasma region in which the plasma is formed;

a radio frequency plasma generating electric power supply in electrical communication with the plasma electrode; and a radio frequency bias generating electric power supply in electrical communication with the bias electrode and the plasma electrode.

10. An apparatus as in claim 9 further comprising at least one filter configured to filter the plasma generating electric power applied to the plasma electrode.

11. An apparatus as in claim 9 further comprising at least one impedance matching network connected between the bias generating electric power supply and the bias electrode.

12. An apparatus as in claim 9 further comprising a power splitter in communication with the radio frequency bias generating electric power supply and configured to provide a first portion of the bias electric power to the bias electrode and a second portion of the bias electric power to the plasma electrode.

13. An apparatus as in claim 12 wherein the power splitter is further configured to provide respective portions of the second portion of the bias electric power to each of the sub-electrodes.

14. An apparatus as in claim 13 further comprising at least one phase shifter configured to adjust relative phases between respective portions of the second portion of the bias electric power provided to each of the sub-electrodes.

15. An apparatus as in claim 12 further comprising an additional power splitter in communication with the radio frequency bias generating electric power supply and configured to provide respective portions of the second portion of the bias electric power to each of the sub-electrodes.

16. An apparatus as in claim 15, further comprising at least one phase shifter configured to adjust relative phases between respective portions of the second portion of the bias electric power provided to each of the sub-electrodes.

17. An apparatus as in claim 15 further comprising at least one filter configured to filter respective portions of the second portion of the bias electric power provided to each of the sub-electrodes.

18. An apparatus as in claim 15 further comprising at least one impedance matching network configured to match impedance of respective portions of the second portion of the bias electric power provided to each of the sub-electrodes.

19. An apparatus as in claim 13 further comprising at least one filter configured to filter respective portions of the second portion of the bias electric power provided to each of the sub-electrodes.

20. An apparatus as in claim 13 further comprising at least one impedance matching network configured to match impedance of respective portions of the second portion of the bias electric power provided to each of the sub-electrodes.

21. An apparatus as in claim 9 further comprising a power splitter in communication with the radio frequency bias generating electric power supply and configured to provide respective portions of the bias electric power to each of the sub-electrodes.

22. An apparatus as in claim 21, further comprising at least one phase shifter configured to adjust relative phases between respective portions of the bias electric power provided to each of the sub-electrodes.

23. An apparatus as in claim 21 further comprising at least one filter configured to filter respective portions of the bias electric power provided to each of the sub-electrodes.

24. An apparatus as in claim 21 further comprising at least one impedance matching network configured to match impedance of respective portions of the bias electric power provided to each of the sub-electrodes.

* * * * *